US010029864B2

(12) United States Patent
Harada

(10) Patent No.: US 10,029,864 B2
(45) Date of Patent: Jul. 24, 2018

(54) ATTITUDE CHANGING APPARATUS, ALIGNING APPARATUS, ATTITUDE CHANGING METHOD AND ALIGNING METHOD

(71) Applicant: MURATA MANUFACTURING CO., LTD., Kyoto-fu (JP)

(72) Inventor: Masatoshi Harada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/259,367

(22) Filed: Sep. 8, 2016

(65) Prior Publication Data
US 2016/0376112 A1 Dec. 29, 2016

Related U.S. Application Data

(63) Continuation of application No. PCT/JP2015/056128, filed on Mar. 2, 2015.

(30) Foreign Application Priority Data

Mar. 13, 2014 (JP) .................................. 2014-050204

(51) Int. Cl.
*B65G 47/248* (2006.01)
*B65G 47/84* (2006.01)
(Continued)

(52) U.S. Cl.
CPC ......... *B65G 47/848* (2013.01); *B65G 47/248* (2013.01); *B65G 47/763* (2013.01); *B65G 47/846* (2013.01); *H05K 13/022* (2013.01)

(58) Field of Classification Search
CPC .. B65G 47/848; B65G 47/248; B65G 47/763; B65G 47/846; B65G 47/24; B65G 47/244; B65G 47/1492
(Continued)

(56) References Cited

U.S. PATENT DOCUMENTS 4,822,967 A * 4/1989 Kumagami ............... A23L 3/01
219/700
6,527,101 B1 3/2003 Miyamoto
(Continued)

FOREIGN PATENT DOCUMENTS

| JP | S64-024030 U | 2/1989 | |
|----|----|----|----|
| JP | H03-015822 U | 2/1991 | |
| JP | H05-095920 A | 4/1993 | |
| JP | 8-231031 | * 8/1996 | ............. B65G 47/14 |
| JP | H08-231031 A | 9/1996 | |
| JP | 2000-072230 A | 3/2000 | |
| JP | 2002-255336 A | 9/2002 | |
| JP | 2009-249068 A | 10/2009 | |
| WO | 2006/027793 A1 | 3/2006 | |

OTHER PUBLICATIONS

International Search Report issued in PCT/JP2015/056129; dated Jun. 2, 2015.
(Continued)

*Primary Examiner* — Lynn E Schwenning
(74) *Attorney, Agent, or Firm* — Studebaker & Brackett PC

(57) ABSTRACT

A component having a rectangular parallelepiped shape where the component includes a pair of rectangular end surfaces which are opposite to each other and four side surfaces which connect the end surfaces to each other is stored in a cavity which penetrates between main surfaces of a conveyance member, and the conveyance member is moved relative to a base. Along with the relative movement of the conveyance member, the component having the end surface brought into contact with a reference surface has the end surface brought into contact with an inclined surface of an engaging groove and is inclined.

6 Claims, 9 Drawing Sheets

(51) Int. Cl.
*B65G 47/76* (2006.01)
*H05K 13/02* (2006.01)

(58) Field of Classification Search
USPC .......................................................... 414/781
See application file for complete search history.

(56) References Cited

U.S. PATENT DOCUMENTS

2003/0089184 A1    5/2003  Kimura et al.
2017/0011943 A1*   1/2017  Harada ............. H01L 21/67721

OTHER PUBLICATIONS

Written Opinion issued in PCT/JP2015/056129; dated Jun. 2, 2015.
International Search Report issued in PCT/JP2015/056128; dated Jun. 2, 2015.
Written Opinion issued in PCT/JP2015/056128; dated Jun. 2, 2015.
International Preliminary Report on Patentability issued in PCT/JP2015/056128; dated Sep. 13, 2016.
An Office Action; "Notification of Preliminary Rejection," issued by the Korean Patent Office dated Jun. 21, 2017, which corresponds to Korean Patent Application No. 10-2016-7023299 and is related to U.S. Appl. No. 15/259,367; with English language translation.

* cited by examiner

FIG. 11 --Prior Art--
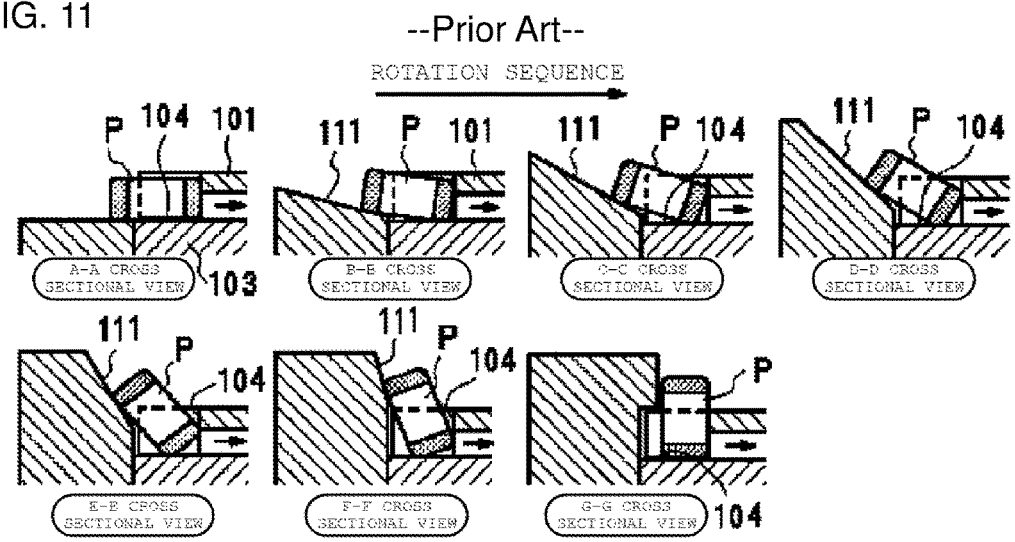
FIG. 12 --Prior Art--
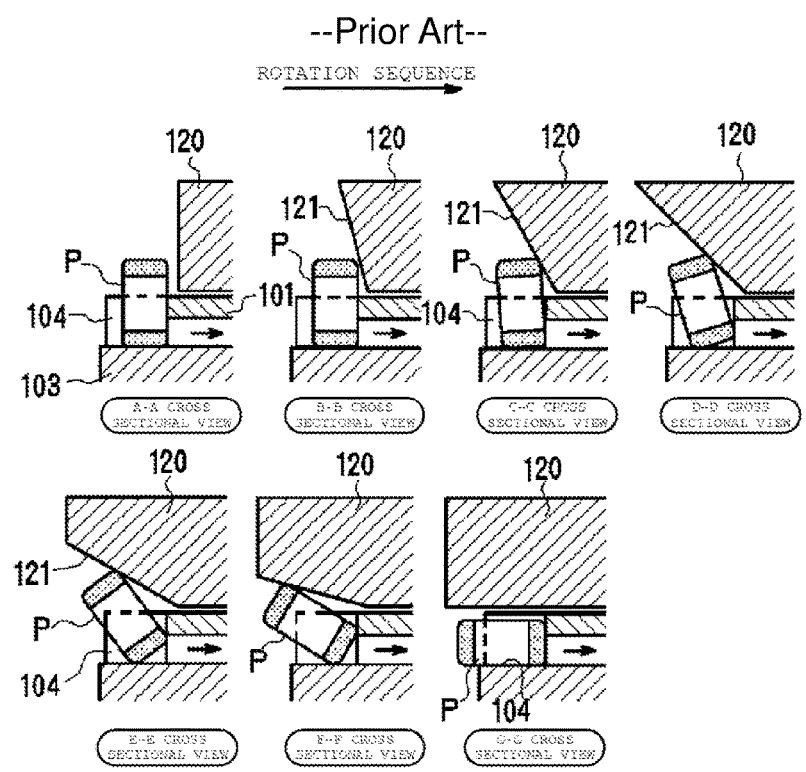

_US 10,029,864 B2_

ATTITUDE CHANGING APPARATUS, ALIGNING APPARATUS, ATTITUDE CHANGING METHOD AND ALIGNING METHOD

CROSS REFERENCE TO RELATED APPLICATIONS

This application claims benefit of priority to Japanese Patent Application 2014-050204 filed Mar. 13, 2014, and to International Patent Application No. PCT/JP2015/056128 filed Mar. 2, 2015, the entire content of which is incorporated herein by reference.

TECHNICAL FIELD

The present disclosure relates to an attitude changing apparatus, an aligning apparatus and an attitude changing method, and an aligning method, and more particularly to a technique for changing an attitude of a component having a rectangular parallelepiped shape.

BACKGROUND

Conventionally, there has been known an apparatus which changes an attitude of a component having a rectangular parallelepiped shape.

For example, as shown in FIG. 11 which is an explanatory view, in changing an attitude of a chip component P having a rectangular parallelepiped shape into a vertical position from a horizontal position, the chip component P in the horizontal position is sucked into and held by a cavity 104 which is formed by cutting along an outer periphery of a rotor 101, and the rotor 101 is rotated relative to a base 103. A guide surface 111 is formed on the base 103, a radially outer side of the chip component P is lifted by the guide surface 111 along with the rotation of the rotor 101 thus bringing the chip component P into the vertical position.

In addition, as shown in FIG. 12 which is an explanatory view, in changing the attitude of the chip component P into the horizontal position from the vertical position, the chip component P in the vertical position is sucked into and held by the cavity 104 formed by cutting along the outer periphery of the rotor 101, and a biasing member 120 is disposed above the rotor 101. Along with the rotation of the rotor 101, a contact surface 121 of the biasing member 120 is brought into contact with an upper portion of the chip component P so that the upper portion of the chip component P is biased by the contact surface 121 whereby the chip component P is brought into the horizontal position (see patent JP-A-2000-72230, for example).

SUMMARY

Problem to be Solved by the Disclosure

In the former case where the attitude of the chip component P is changed into the vertical position from the horizontal position, the attitude of the chip component can be changed with certainty. However, in the latter case where the attitude of the chip component is changed into the horizontal position from the vertical position, depending on a magnitude of a frictional force between the chip component and the cavity or between the chip component and the base, the position of a fulcrum of rotation which is brought into contact with the base when the chip component is inclined changes. Since irregularities are liable to be generated in the frictional force, the position of the fulcrum of the rotation is liable to change. When the fulcrum of the rotation of the chip component is displaced radially outward, inclination of the chip component is insufficient thus giving rise to a possibility that the attitude of the chip component is not changed.

The present disclosure has been made in view of such circumstances, and it is an object of the present disclosure to provide an attitude changing apparatus, an aligning apparatus and an attitude changing method, and an aligning method which can change an attitude of a component with certainty.

Means for Solving the Problem

To overcome the above-mentioned drawbacks, the present disclosure provides an attitude changing apparatus having the following configuration.

The attitude changing apparatus is used for a component having a rectangular parallelepiped shape where the component includes a pair of rectangular end surfaces which are opposite to each other and four side surfaces which connect the end surfaces to each other. The attitude changing apparatus includes a base, a conveyance member and a biasing (urging force) member. (a) The base has a reference surface and an engaging groove formed in a groove shape with respect to the reference surface. The engaging groove includes an inclined surface which is inclined with respect to a direction orthogonal to a direction along which one end and the other end of the engaging groove are connected to each other. The inclined surface is formed such that the end surface of the component can be brought into contact with the inclined surface in a zone from one end to a predetermined position between one end and the other end. (b) The conveyance member has first and second main surfaces which are opposite to each other, and a cavity which penetrates between the first and second main surfaces. The conveyance member moves relatively with respect to the base such that the second main surface faces the reference surface and the cavity sequentially faces the engaging groove from one end to the other end of the engaging groove. The cavity is formed such that the component is stored in the cavity in a state where the end surface of the component is brought into contact with the reference surface and, thereafter, the component is moved in a state where the component is stored in the cavity, and the component is brought into an attitude where the side surface of the component is brought into contact with the reference surface, and, a portion of the component which is brought into contact with the inclined surface at the predetermined position projects from the first main surface. (c) The biasing (urging force) member is formed such that the biasing member is brought into contact with the portion of the component which projects from the first main surface at the predetermined position, and along with the relative movement of the conveyance member with respect to the base, the component is biased (added force) so that the component is rotated about a corner or a round corner of the component on a valley side of the inclined surface thus separating the end surface of the component from the inclined surface. (d) The component stored in the cavity is conveyed along an engaging groove along with the relative movement of the conveyance member with respect to the base and hence, the component is changed into the attitude where the side surface of the component is brought into contact with the reference surface from the attitude where the end surface of the component is brought into contact with the reference surface.

In the above-mentioned configuration, when the component which is stored in the cavity and has the end surface thereof brought into contact with the reference surface is moved along with the relative rotation of the conveyance member with respect to the base and reaches one end of the engaging groove, the end surface is brought into contact with the inclined surface so that the component is inclined. When the component passes the predetermined position, the component is biased by the biasing member so that the end surface of the component is separated from the inclined surface and is further inclined. Then, when the component passes the other end of the engaging groove, the component is to have an attitude where the side surface of the component is brought into contact with the reference surface. That is, the component which is stored in the cavity and has the end surface thereof brought into contact with the reference surface is changed into an attitude where the center line which connects the end surfaces to each other is parallel to the reference surface from an attitude where the center line is perpendicular to the reference surface by passing the engaging groove.

With such a configuration, with respect to the component which is stored in the cavity and has the end surface thereof brought into contact with the reference surface, even when the component is moved to a valley side along the inclined surface of the engaging groove when the component is biased by the biasing member, the movement of the component is interrupted when the component approaches the bottom of the engaging groove and hence, the component is rotated using a corner or a rounded corner on a valley side of the inclined surface of the engaging groove as a fulcrum. Accordingly, irregularities in the position of the fulcrum of rotation can be suppressed and hence, the attitude of the component can be changed with certainty.

It is preferable that the attitude changing apparatus further include a suction unit which sucks the component stored in the cavity. The suction unit is disposed on a second main surface side of the conveyance member, and sucks the component in a direction opposite to a direction that the component is biased by the biasing member. For example, a suction hole is formed in the conveyance member. The suction hole is communicated with the cavity, is connected to a pressure reduction source, and sucks the component stored in the cavity in a direction opposite to the bottom line with respect to the inclined surface.

In this case, the component stored in the cavity is pulled so that the positional displacement of the component can be prevented whereby the changing of the attitude of the component can be performed in a stable manner. Falling and positional displacement of the component from the cavity can be prevented and hence, the direction of the reference surface can be selected arbitrarily. Further, even when biasing by the biasing member is finished after the component is inclined to some extent by the biasing member, it is possible to further incline the component by suction caused by the suction hole.

The present disclosure further provides an aligning apparatus which includes the above-mentioned attitude changing apparatus having the respective configurations, and a component supply unit which supplies the component into the cavity. The component supply unit supplies the component into the cavity in such a manner that the end surface of the component is brought into contact with the reference surface or in such a manner that the side surface of the component is brought into contact with the reference surface. The component which is supplied into the cavity in such a manner that the end surface is brought into contact with the reference surface is conveyed along the engaging groove along with the relative movement of the conveyance member with respect to the base, and is biased by the biasing member so that the component is changed into an attitude where the side surface is brought into contact with the reference surface. The component which is supplied into the cavity in such a manner that the side surface is brought into contact with the reference surface is conveyed along with the relative movement of the conveyance member with respect to the base. However, the component is not biased by the biasing member so that an attitude of the component where the side surface is brought into contact with the reference surface is maintained.

The present disclosure also provides an attitude changing method having the following configuration to overcome the above-mentioned drawbacks.

The attitude changing method is used for a component having a rectangular parallelepiped shape where the component includes a pair of rectangular end surfaces which are opposite to each other and four side surfaces which connect the end surfaces to each other. The attitude changing method includes: (i) a first step of storing the component into a cavity of a conveyance member having first and second main surfaces which are opposite to each other and the cavity which penetrates between the first and second main surfaces; and (ii) a second step of moving the conveyance member relatively with respect to a base having a reference surface and an engaging groove formed in a groove shape with respect to the reference surface and making the component stored in the cavity sequentially face the engaging groove from one end to the other end of the engaging groove. The second step includes: (a) a first sub step of inclining the component with respect to the reference surface along with advancing of the component from one end to a predetermined position by bringing the end surface of the component which has the end surface thereof brought into contact with the reference surface out of the components stored in the cavity in the first step into contact with an inclined surface of the engaging groove inclined with respect to a direction orthogonal to a direction which connects one end and the other end of the engaging groove from one end of the engaging groove to the predetermined position between one end and the other end; and (b) a second sub step of further inclining the component by bringing a biasing member into contact with a portion of the component projecting from the first main surface at the predetermined position, and by rotating the component about a corner or a rounded corner of the component on a valley side of an inclined surface of the engaging groove by biasing a portion of the component along with the relative movement of the conveyance member with respect to the base thus separating the end surface of the component from the inclined surface. After the second step is finished, the attitude of the component is changed into an attitude where the side surface is brought into contact with the reference surface.

In the above-mentioned method, the component which is stored in the cavity and has the end surface thereof brought into contact with the reference surface is changed into an attitude where the center line which connects the end surfaces to each other is parallel to the reference surface from an attitude where the center line is perpendicular to the reference surface by passing the engaging groove.

With such a method, with respect to the component which is stored in the cavity and has the end surface thereof brought into contact with the reference surface, even when the component is moved to a valley side along the inclined surface of the engaging groove when the component is biased by the biasing member, the movement of the component is interrupted when the component approaches to the bottom of the engaging groove and hence, the component is rotated using a corner or a rounded corner on a valley side of the inclined surface of the engaging groove as a fulcrum. Accordingly, irregularities in the position of the fulcrum of rotation can be suppressed at the time of changing the attitude of the component and hence, the attitude of the component can be changed with certainty.

It is preferable that, in the second step, the component stored in the cavity be sucked in a direction opposite to a direction that the component is biased by the biasing member.

In this case, the component stored in the cavity is pulled so that the positional displacement of the component can be prevented whereby the changing of the attitude of the component can be performed in a stable manner. Falling and positional displacement of the component from the cavity can be prevented and hence, the direction of the reference surface can be selected arbitrarily. Further, even when biasing by the biasing member is finished after the component is inclined to some extent by the biasing member, it is possible to further incline the component by suction.

The present disclosure also provides an aligning method. That is, in the first step, the component is supplied to the cavity in such a manner that the end surface of the component is brought into contact with the reference surface or in such a manner that the side surface of the component is brought into contact with the reference surface. The component which is supplied into the cavity in such a manner that the end surface is brought into contact with the reference surface in the first step is brought into an attitude where the side surface is brought into contact with the reference surface after the second step is finished. The component which is supplied into the cavity in such a manner that the side surface is brought into contact with the reference surface in the first step is brought into an attitude where the side surface is brought into contact with the reference surface after the second step is finished.

Advantageous Effect of the Disclosure

According to the present disclosure, irregularities in a position of a fulcrum of rotation when an attitude of a component is changed can be suppressed and hence, the attitude of the component can be changed with certainty.

BRIEF DESCRIPTION OF THE DRAWINGS

FIG. 11 is an explanatory view of an operation for changing a component into a vertical position from a horizontal position (see JP-A-2000-72230).

FIG. 12 is an explanatory view of an operation for changing a component into a horizontal position from a vertical position (see JP-A-2000-72230).

DETAILED DESCRIPTION

Embodiments of the present disclosure are described with reference to drawings hereinafter.

Embodiment 1

An attitude changing apparatus according to an embodiment 1 is described with reference to FIG. 1A to FIG. 8.

Figure 1A:
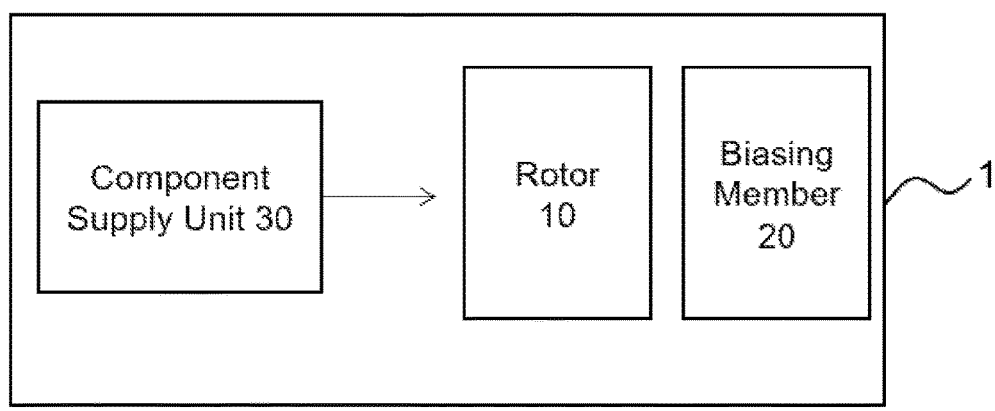
FIG. 1A is a diagram of an attitude changing apparatus according to an exemplary embodiment.
Figure 1B:
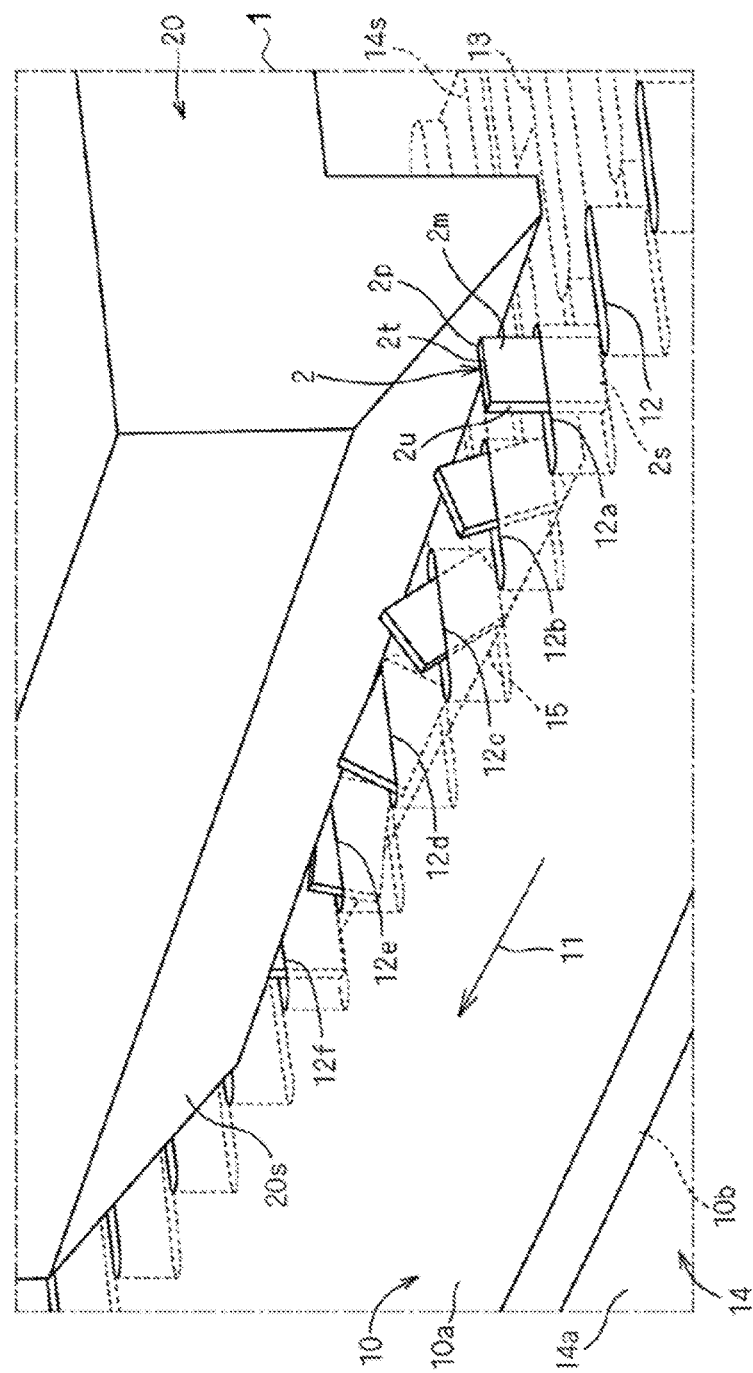
FIG. 1B is a perspective view showing the configuration of a main part of an attitude changing apparatus according to an exemplary embodiment (embodiment 1).
Figure 2:
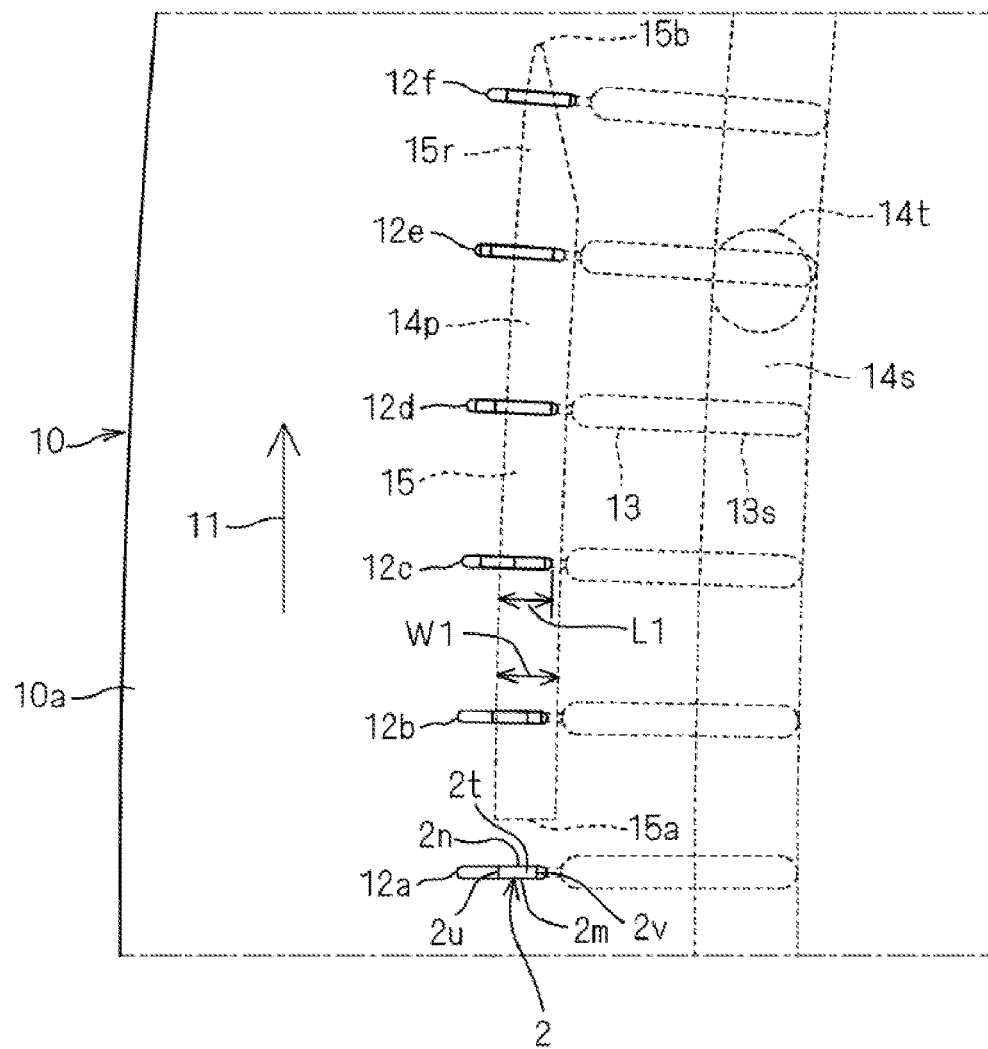
FIG. 2 is a plan view showing the configuration of the main part of the attitude changing apparatus (embodiment 1).

FIGS. 1A and 1B show an attitude changing apparatus according to the present disclosure. FIG. 1A is a high level diagram, and FIG. 1B is a perspective view showing the configuration of a main part of the attitude changing apparatus 1. FIG. 2 is a plan view showing the configuration of the main part of the attitude changing apparatus 1. As shown in FIGS. 1A, 1B and 2, the attitude changing apparatus includes: a base 14 having a reference surface 14a; a rotor 10 which is a conveyance member; a biasing member 20; and a component supply unit 30. The attitude changing apparatus is provided for changing an attitude of a component 2. The attitude changing apparatus can be used in various applications such as the selection of the components 2 based on a characteristic, the selection of the components 2 based on external appearance, external electrode forming and lead mounting.

The component 2 has a rectangular parallelepiped shape, and has rectangular end surfaces 2s, 2t which are opposite to each other and four side surfaces 2m, 2n, 2u, 2v which connect the end surfaces 2s, 2t to each other. For example, the component 2 is an electronic component such as a multi-layer ceramic capacitor, a thermistor or a coil. Assuming a length between the end surfaces 2s, 2t of the component 2 as L, a length between the pair of side surfaces 2u, 2v of the component 2 on one side which are opposite to each other as W, and a length between the pair of side surfaces 2m, 2n of the component 2 on the other side which are opposite to each other as T, and the relationships of L>W and L>T are established. Further, the lengths W and T are set to values which fall within a range of from 0.05 to 5 mm, and a ratio L/W is set to a value which falls within a range of 1.1 to 5.

The rotor 10 has a disc shape, and has first and second main surfaces 10a, 10b which are opposite to each other. The second main surface 10b of the rotor 10 faces the reference surface 14a of the base 14, and the rotor 10 is continuously or intermittently rotated with respect to the base 14 in a direction indicated by an arrow 11. As a material of the rotor 10, a resin, metal, glass, glass epoxy resin, ceramics such as zirconia or the like can be selectively used.

A plurality of cavities 12, 12a to 12f are formed in the rotor 10 in a penetrating manner between the first and second main surfaces 10a, 10b. Cavities 12, 12a to 12f respectively extend radially with respect to the center of rotation of the rotor 10, and are arranged at equal intervals in a circumferential direction. The component 2 can be stored in the cavities 12, 12a to 12f respectively. The cavities 12, 12a to 12f are formed such that the components 2 which are in a vertical position after being stored in the cavities 12, 12a to 12f can be laid down and held in a horizontal position in a state where the components 2 are stored in the cavities 12, 12a to 12f. Immediately after the components 2 are stored in the cavities 12, 12a to 12f, a portion 2p of the component 2 projects from the first main surface 10a of the rotor 10.

To be more specific, a length (a size in a radial direction) of the cavities 12, 12a to 12f is expressed as L+α, and the length L+α is set larger than a length L, which is a length between the end surfaces 2s, 2t of the component 2. For example, a is set equal to or more than 0.1 mm (α≥0.1 mm). A width (a size in a circumferential direction) of the cavities 12, 12a to 12f is set equal to or larger than a length T, which is a length between the pair of side surfaces 2m, 2n on the other side of the component 2. For example, the width of the cavities 12, 12a to 12f is set to 1.1 mm. A thickness of the rotor 10 is expressed as W−β. The thickness W−β is set smaller than the length W, which is a length between the pair of side surfaces 2u, 2v of the component 2 such that the side surface 2v projects from the first main surface 10a of the rotor 10 even when the component 2 is brought into a horizontal position. For example, β is set to a value equal to or more than 0.01 mm (β≥0.01 mm).

The biasing member 20 has a contact surface 20s disposed adjacently to the first main surface 10a of the rotor 10, and is held stationarily without making relative movement with respect to the base 14. The contact surface 20s of the biasing member 20 is disposed at a height position higher than the length L between the end surfaces 2s, 2t of the component 2 with reference to the reference surface 14a. With such a configuration, the contact surface 20s of the biasing member 20 is brought into contact with the components 2 stored in the cavities 12b to 12e in a vertical position.

As a material of the biasing member 20, metal, a resin, glass, ceramics such as zirconia or the like can be selectively used. The biasing member 20 may be resiliently supported using a spring or the like. In this case, it is possible to alleviate an impact generated when the component 2 is brought into contact with the contact surface 20s of the biasing member 20 or to suppress a biasing force applied to the component 2 to a predetermined value or below.

Figure 3:
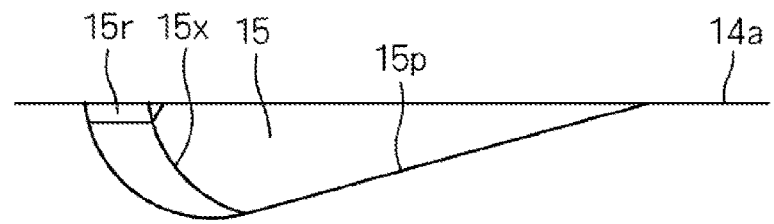
FIG. 3 is a perspective view of an engaging groove (embodiment 1).

As shown in FIG. 2, a groove-shaped engaging groove 15 is formed on the base 14 at a position corresponding to the cavities 12a to 12f. The engaging groove 15 extends in an approximately circumferential direction from one end 15a to the other end 15b. FIG. 3 is a cross-sectional perspective view of the engaging groove 15 as viewed in a direction which connects one end 15a and the other end 15b to each other. As shown in FIG. 3, the engaging groove 15 has a side wall surface 15x formed on a side surface of the engaging groove 15 from one end 15a to the other end 15b of the engaging groove 15, and an inclined surface 15p formed radially inward with respect to the side wall surface 15x. The end surface 2s of the component 2 can be brought into contact with the inclined surface 15p. The inclination of the inclined surface 15p with respect to the reference surface 14a is set to 30 degrees, for example.

The engaging groove 15 may be formed such that the inclined surface 15p starts continuously from the reference surface 14a at one end 15a of the engaging groove 15, or may be formed such that the inclined surface 15p starts non-continuously from the reference surface 14a by forming a stepped portion at one end 15a of the engaging groove 15.

At one end 15a of the engaging groove 15, a width W1 in a radial direction of the engaging groove 15 (see FIG. 2) is set larger than the length W between the pair of side surfaces 2u, 2v of the components 2 opposite to each other and is set smaller than the length L between the end surfaces 2s, 2t of the component 2 opposite to each other. Further, a distance L1 (see FIG. 2) in a radial direction from an outer end of the engaging groove 15 in a radial direction to an inner end of the cavities 12, 12a to 12f in a radial direction is set to W+δ such that the component 2 is supported by the inclined surface 15p of the engaging groove 15. For example, δ is set to a value which falls within a range of 0.05 to 1 mm (δ=0.05 to 1 mm).

An end portion 15r of the engaging groove 15 on the other end 15b side is formed smoothly so as to prevent the component 2 from being caught by the engaging groove 15 when the component 2 is removed from the engaging groove 15.

As a material of the base 14, metal, a resin, glass, ceramics such as zirconia or the like can be selectively used.

As shown in FIG. 1B and FIG. 2, on the second main surface 10b of the rotor 10, as a suction unit, suction holes 13 which communicate with end portions of the cavities 12, 12a to 12f on a radially inner direction are formed. An inner diameter of the suction hole 13 is set to a value which falls within a range of from 10 to 90% of the thickness of the rotor.

FIGS. 4(a) through 4(c) and FIGS. 5(a) through 5(c) are cross-sectional views of a main part of the attitude changing apparatus showing steps of changing the attitude. As shown in FIG. 2, FIGS. 4(a) through 4(c) and FIGS. 5(a) through 5(c), an inner side 13s of the suction hole 13 in a radial direction communicates with a suction groove 14s formed on the reference surface 14a of the base 14. The suction groove 14s is connected to a pressure reducing source through an opening 14t formed on a bottom surface of the suction groove 14s, and performs suction in a direction indicated by an arrow 80 in FIGS. 4(a) through 4(c) and FIGS. 5(a) through 5(c). With such an operation, the components 2 stored in the cavities 12a to 12f are sucked toward radially inner side ends of the cavities. In other words, the components 2 are sucked in a direction opposite to a direction that the components 2 are biased by the biasing member 20.

Next, the operation of the attitude changing apparatus according to the embodiment 1 is described with reference to FIGS. 4(a) through 4(c) and FIGS. 5(a) through 5(c). FIGS. 4(a) through 4(c) and FIGS. 5(a) through 5(c) show the steps of changing the attitude. FIGS. 4(a) to 4(c) and FIGS. 5(a) to 5(c) respectively correspond to cross-sectional positions of the cavities 12a to 12f.

Figure 4A:
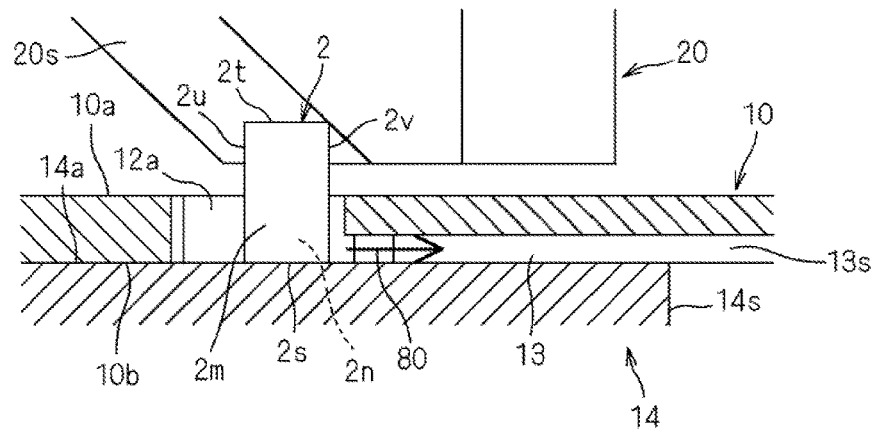
FIGS. 4(a) through 4(c) are cross-sectional views of a main part of the attitude changing apparatus showing steps of changing the attitude (embodiment 1).

As shown in FIG. 4(a), the component 2 supplied to the cavity 12a by the component supply unit is in a vertical position where the end surface 2s is brought into contact with the reference surface 14a.

Figure 4B:
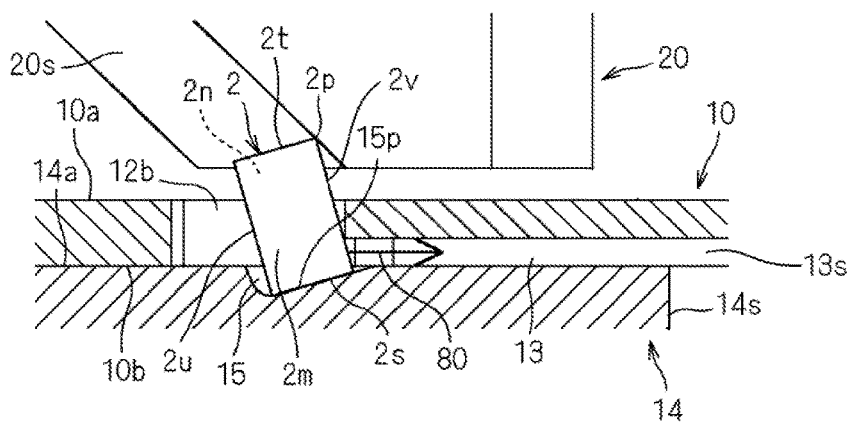
Figure 4C:
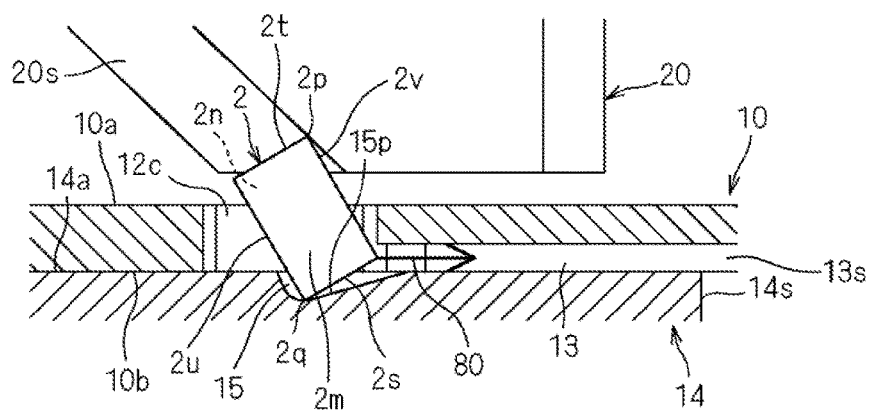
Figure 5A:
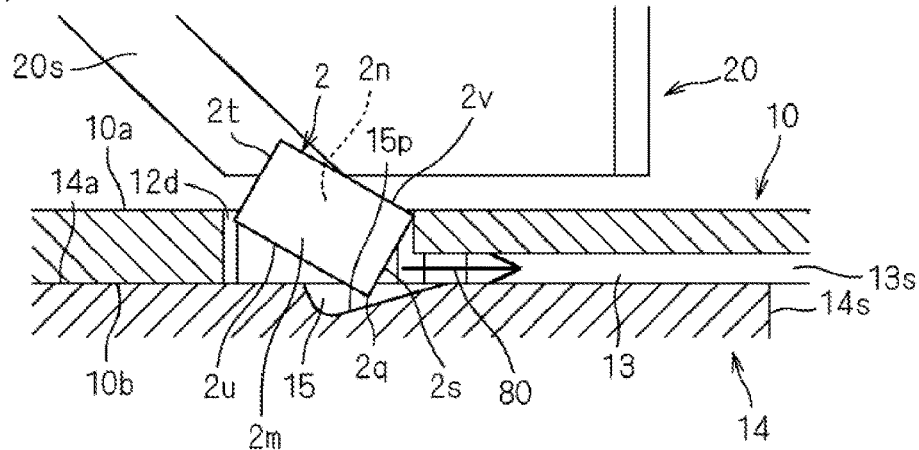
FIGS. 5(a) through 5(c) are cross-sectional views of the main part of the attitude changing apparatus showing steps of changing the attitude (embodiment 1).
Figure 5B:
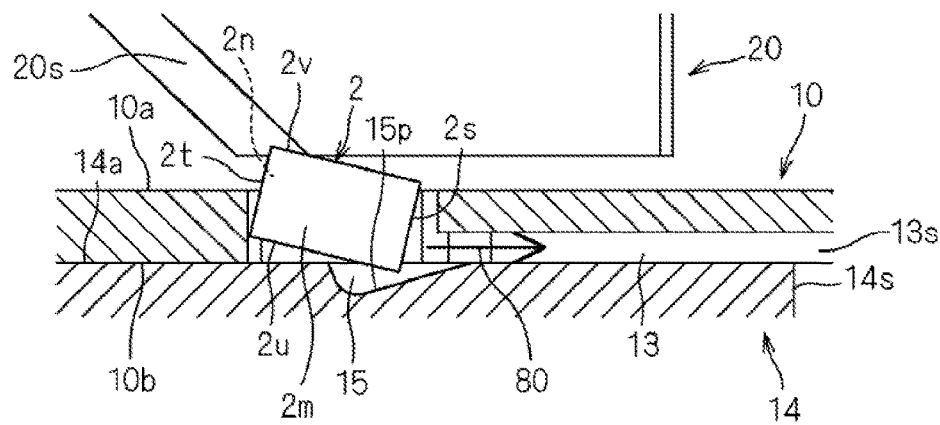
Figure 5C:
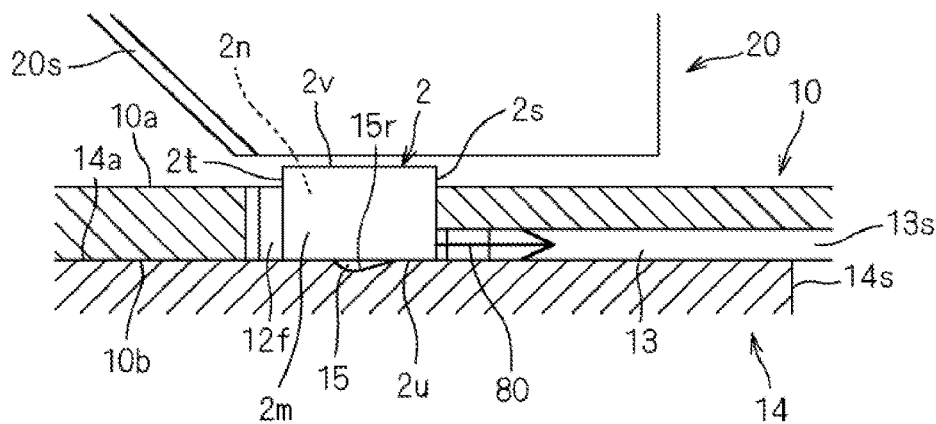

When the component 2 in the vertical position reaches one end 15a of the engaging groove 15 along with the rotation of the rotor 10, during a zone from one end 15a of the engaging groove 15 to a predetermined position (the position between one end 15a and the other end 15b), as shown in FIG. 4(b), the end surface 2s of the component 2 is brought into contact with the inclined surface 15*p* of the engaging groove 15 so that the component 2 is conveyed to the predetermined position from one end 15*a* of the engaging groove.

When the component 2 reaches the predetermined position along with the rotation of the rotor 10, the contact surface 20*s* of the biasing member 20 is brought into contact with the portion 2*p* of the component 2 which projects from the first main surface 10*a* of the rotor 10. When the rotor 10 is further rotated, as shown in FIG. 4(*c*), the contact surface 20*s* biases the portion 2*p* of the component 2 so that the component 2 is rotated about a corner or a rounded corner 2*q* of the component 2 disposed on a valley side of the inclined surface 15*p* of the engaging groove 15 and hence, the end surface 2*s* is separated from the inclined surface 15*p* of the engaging groove 15 whereby the component 2 is inclined. That is, the component 2 is laid down radially outward. When the portion 2*p* of the component 2 is biased by the contact surface 20*s* of the biasing member 20, even when the component 2 is moved in a direction toward the bottom of the engaging groove along the inclined surface 15*p*, when the component 2 approaches to the bottom of the engaging groove 15, the movement of the component 2 is interrupted by a curved surface of the inner wall surface 15*x* of the engaging groove 15 whereby the component 2 is rotated using the corner or the rounded corner 2*q* on a bottom side of the engaging groove 15 as a fulcrum.

When the rotor 10 is further rotated, as shown in FIGS. 5(*a*) and 5(*b*), the component 2 is further rotated by being biased by the contact surface 20*s* of the biasing member 20 so that the side surfaces 2*u* of the component 2 enter the cavities 12*d*, 12*e*.

When the rotor 10 is further rotated, as shown in FIG. 5(*c*), a width and a depth of the end portion 15*r* of the engaging groove 15 become small and hence, the side surface 2*u* of the component 2 is brought into contact with the reference surface 14*a* so that the component 2 is to have a horizontal position.

When the rotor 10 is further rotated, the component 2 passes the other end 15*b* of the engaging groove 15 while being held in a horizontal position where the side surface 2*u* of the component 2 is supported by the reference surface 14*a*.

With such operations, when the component 2 which is stored in the cavity 12 in a vertical position passes the engaging groove 15 along with the rotation of the rotor 10, an attitude of the component 2 is changed into a horizontal position. The movement of the component 2 is prevented by the inner wall surface 15*x* of the engaging groove 15 and the component 2 is rotated and hence, the irregularities in the position of the fulcrum of rotation are suppressed whereby the attitude of the component 2 can be changed with certainty.

Due to suction through the suction hole 13, first, as shown in FIGS. 4(*a*) to 4(*c*), a lower portion of the side surface 2*v* of the component 2 is sucked so that a suction force acts in a direction that the vertical position of the component 2 is held. After the component 2 is rotated, as shown in FIGS. 5(*a*) to 5(*c*), the end surface 2*s* is sucked radially inward and hence, the suction through the suction hole 13 accelerates to change the attitude of the component 2 into the horizontal position.

Due to suction through the suction holes 13, the components 2 are pulled to radially inner end portions of the cavities 12, 12*a* to 12*f* and hence, the positional displacement of the components 2 can be prevented whereby changing of the attitude of the components 2 can be performed in a stable manner. Since the falling or the positional displacement of the components 2 from the cavities 12, 12*a* to 12*f* can be prevented due to the suction through the suction holes 13, it is possible to arbitrarily select the direction of the reference surface 14*a*. For example, the reference surface 14*a* can be inclined from a horizontal plane or the reference surface 14*a* can be set in a vertical direction.

Further, the attitude changing apparatus may be configured such that a component is laid down radially inward in place of being laid down radially outward. In this case, an end surface of the component is brought into contact with an inclined surface more radially outside than an inner wall surface of the engaging groove is and, thereafter, the component is laid down radially inward. The suction unit is formed such that the component is sucked radially outward of the cavity.

Embodiment 2

An aligning apparatus according to embodiment 2 is described. The aligning apparatus according to embodiment 2 has substantially the same configuration as the aligning apparatus according to embodiment 1. The aligning apparatus of embodiment 2 differs from the aligning apparatus according to embodiment 1 with respect to a point that a component supply unit supplies components to cavities without aligning the directions of the components.

In the aligning apparatus according to embodiment 2, among the components which are supplied to the cavities by the component supply unit, in the same manner as embodiment 1, when the component having an end surface thereof brought into contact with a reference surface passes an engaging groove, the component is rotated by a biasing force of a biasing member so that, after the component passes the engaging groove, an attitude of the component is changed into an attitude where a side surface of the component is brought into contact with the reference surface. On the other hand, among the components which are supplied to the cavities by the component supply unit, the component having a side surface thereof brought into contact with the reference surface passes the engaging groove without being brought into contact with the biasing member. Accordingly, even after the component passes the engaging groove, the attitude of the component is held at the attitude where the side surface is brought into contact with the reference surface so that the attitude is not changed.

Next, modifications 1 to 5 of embodiment 1 are described with reference to FIG. 6 to FIG. 8.

Modification 1

Figure 6:
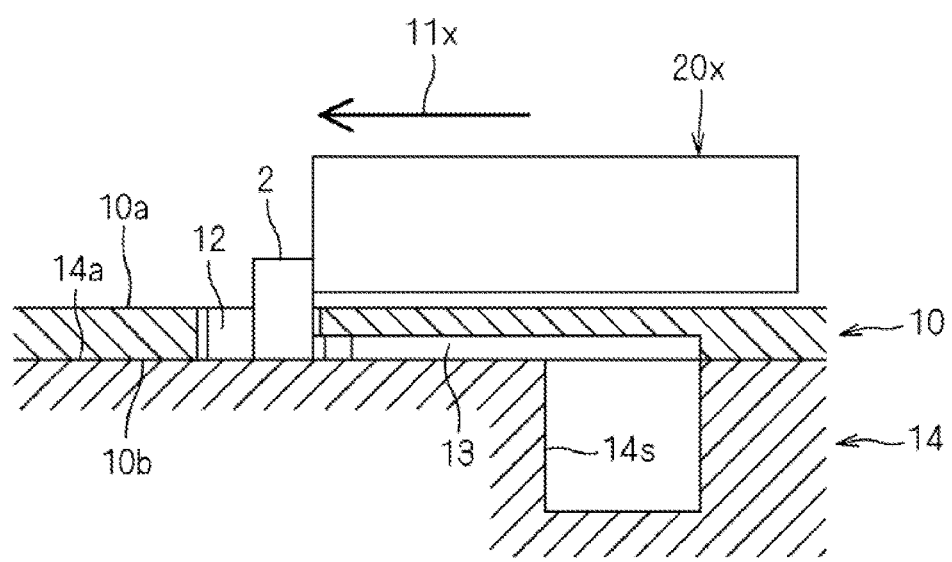
FIG. 6 is a cross-sectional view showing the configuration of a main part of an attitude changing apparatus (modification 1).

FIG. 6 is a cross-sectional view of the configuration of a main part of an attitude changing apparatus according to a modification 1. As shown in FIG. 6, when a rotor 10 is being stopped, a biasing member 20*x* moves radially outward as indicated by an arrow 11*x* and hence, the biasing member 20*x* is brought into contact with a portion of a component 2 which projects from a first main surface 10*a* of the rotor 10 whereby the component 2 is biased and laid down.

Modification 2

Figure 7:
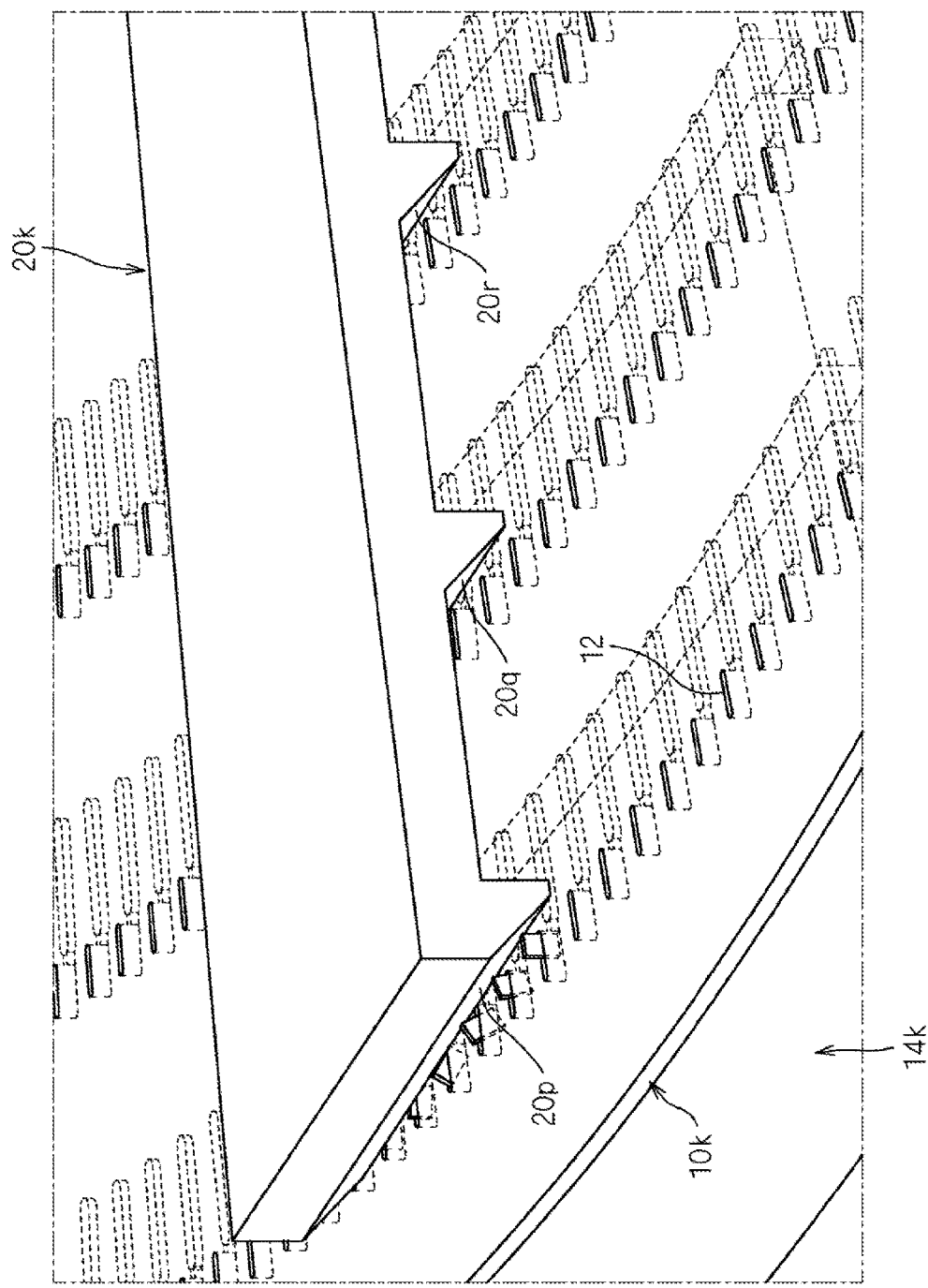
FIG. 7 is a perspective view showing the configuration of a main part of an attitude changing apparatus (modification 2).

FIG. 7 is a perspective view showing the configuration of a main part of an attitude changing apparatus according to a modification 2. As shown in FIG. 7, cavities 12 are disposed on a rotor 10*k* at equal angular intervals concentrically in plural circles, and a biasing member 20*k* has a plurality of contact surfaces 20*p*, 20*q*, 20*r*. Biasing members which are separate from each other may be provided for the contact surfaces 20*p*, 20*q*, 20*r* respectively.

Modification 3

Figure 8A:
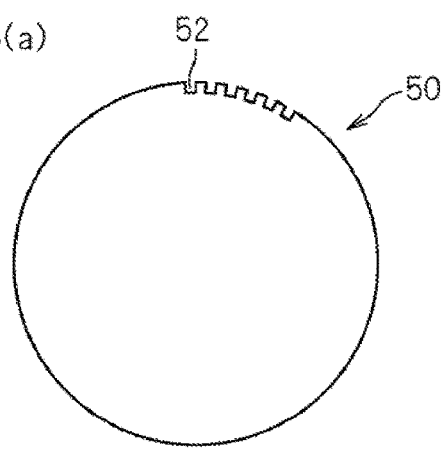
FIGS. 8(a) and 8(b) are plan views showing the schematic configuration of a rotor (modification 3).
Figure 8B:
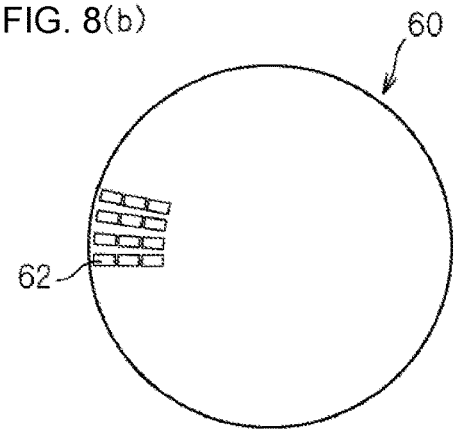

FIGS. 8(a) and 8(b) are plan views showing the schematic configurations of rotors 50, 60 according to a modification 3. The rotor 50 shown in FIG. 8(a) is configured such that cavities 52 which penetrate the rotor 50 between main surfaces which are opposite to each other are formed in a notched shape along an outer periphery of the rotor 50. The rotor 60 shown in FIG. 8(b) is configured such that cavities 62 are formed in the rotor 60 at equal angular intervals concentrically in plural circles. In FIGS. 8(a) and 8(b), only some cavities 52 and some cavities 62 are shown.

Modification 4

Figure 9:
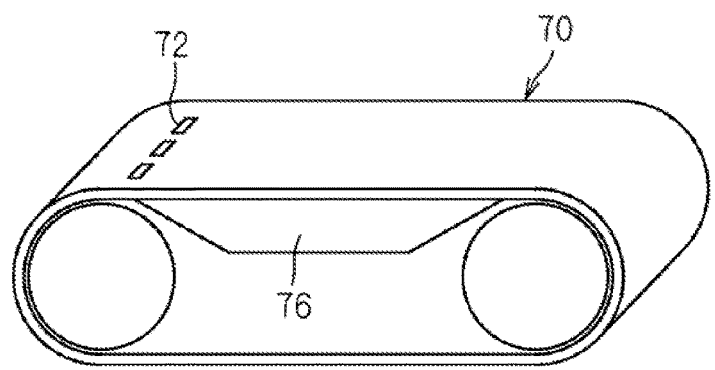
FIG. 9 is a schematic view showing the schematic configuration of an endless belt (modification 4).

FIG. 9 is a schematic view showing the schematic configuration of an endless belt 70 according to a modification 4. As shown in FIG. 9, the endless belt 70 on which cavities 72 are formed is used as a conveyance member, and the endless belt 70 is configured such that an attitude of a component 2 stored in the cavity 72 is changed when the component 2 is conveyed in a straight-line direction or a circumferential direction. As a material for forming the endless belt 70, a resin, metal or the like can be used. A base 76 can be disposed inside or outside the endless belt 70. In FIG. 9, only some cavities 72 are shown. The cavities may be formed in a notched shape along an outer periphery of the endless belt 70.

Modification 5

Figure 10:
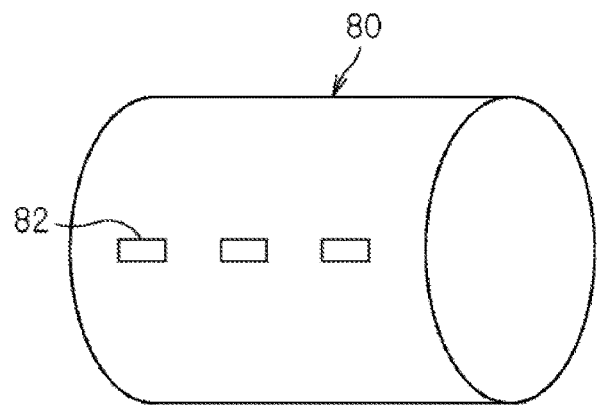
FIG. 10 is a schematic view showing the schematic configuration of a rotary drum (modification 5).

FIG. 10 is a schematic view showing the schematic configuration of a rotary drum 80 according to a modification 5. As shown in FIG. 10, the circular cylindrical rotary drum 80 on which cavities 82 are formed is used as a conveyance member, and a base (not shown in the drawing) is disposed inside or outside of the rotary drum 80. The rotary drum 80 is configured such that an attitude of a component 2 stored in the cavity 82 is changed when the component 2 is conveyed in a circumferential direction. As a material for forming the rotary drum 80, a resin, metal, glass, ceramics such as zirconia or the like can be used. In FIG. 10, only some cavities 82 are shown.

SUMMARY

To recapitulate the above, irregularities in the position of a fulcrum of rotation when the attitude of a component is changed can be suppressed with the provision of the engaging groove and hence, the attitude of the component can be changed with certainty.

The present disclosure is not limited to the above described embodiments, and the present disclosure can be carried out by adding various changes to the embodiments.

For example, the suction unit can pull a component disposed in a cavity by a method other than air suction, for example, static electricity or magnetism.

The invention claimed is:

1. An attitude changing apparatus used for a component having a rectangular parallelepiped shape where the component includes a pair of rectangular end surfaces which are opposite to each other and four side surfaces which connect the end surfaces to each other, the attitude changing apparatus comprising:
  a base having a reference surface and an engaging groove formed in a groove shape with respect to the reference surface, the engaging groove including an inclined surface which is inclined with respect to a direction orthogonal to a direction along which one end and the other end of the engaging groove are connected to each other, a valley on one side of the inclined surface, and the inclined surface being formed such that one of the end surfaces of the component is configured to be brought into contact with the inclined surface in a zone in the inclined surface, and the zone being extended between the one end of the engaging groove and a predetermined position that is located between the one end and the other end of the engaging groove;
  a conveyance member having first and second main surfaces which are opposite to each other and a cavity which penetrates between the first and second main surfaces, the conveyance member being configured to move relatively with respect to the base such that the second main surface faces the reference surface and the cavity sequentially faces the engaging groove from the one end to the other end of the engaging groove, the cavity being formed such that the component is stored in the cavity in a state where the end surface of the component is brought into contact with the reference surface and, thereafter, the component is moved in a state where the component is stored in the cavity, and the component being brought into an attitude where the side surface of the component is brought into contact with the reference surface, and such that a portion of the component at the predetermined position projects from the first main surface; and
  a biasing member, including a surface, formed such that the biasing member is brought into contact with the portion of the component which projects from the first main surface at the predetermined position, and along with the relative movement of the conveyance member with respect to the base, the component is biased so that the component is rotated about a corner or a round corner of the component on the valley side of the inclined surface such that the one end surface of the component is rotated away from the inclined surface, thus separating the end surface of the component from the inclined surface during said rotation about the corner or the round corner, wherein
  the component stored in the cavity is conveyed along the engaging groove along with the relative movement of the conveyance member with respect to the base so that the component is changed into the attitude where the side surface of the component is brought into contact with the reference surface from the attitude where the end surface of the component is brought into contact with the reference surface.

2. The attitude changing apparatus according to claim 1, further comprising a suction unit including a hole, that sucks the component stored in the cavity, the suction unit being disposed on a second main surface side of the conveyance member, and being configured to suck the component in a direction opposite to a direction that the component is biased by the biasing member.

3. An aligning apparatus comprising:
  the attitude changing apparatus described in claim 1; and
  further comprising:
  a component supplier which supplies the component into the cavity, wherein
  the component supplier supplies the component into the cavity in such a manner that the end surface of the component is brought into contact with the reference surface or in such a manner that the side surface of the component is brought into contact with the reference surface,
  the component which is supplied into the cavity in such a manner that the end surface is brought into contact with the reference surface is conveyed along the engaging groove along with the relative movement of the conveyance member with respect to the base, and is biased by the biasing member so that the component is changed into an attitude where the side surface is brought into contact with the reference surface, and the component which is supplied into the cavity in such a manner that the side surface is brought into contact with the reference surface is conveyed along with the relative movement of the conveyance member with respect to the base, and the component is not biased by the biasing member so that an attitude of the component where the side surface is brought into contact with the reference surface is maintained.

4. An attitude changing method used for a component having a rectangular parallelepiped shape where the component includes a pair of rectangular end surfaces which are opposite to each other and four side surfaces which connect the end surfaces to each other, the attitude changing method comprising:

a first step of storing the component into a cavity of a conveyance member having first and second main surfaces which are opposite to each other and the cavity which penetrates between the first and second main surfaces; and a second step of moving the conveyance member relatively with respect to a base having a reference surface and an engaging groove formed in a groove shape with respect to the reference surface and making the component stored in the cavity sequentially face the engaging groove from one end to the other end of the engaging groove, wherein the second step includes:

a first sub step of inclining the component with respect to the reference surface along with advancing of the component from the one end of the engaging groove to a predetermined position of the engaging groove by bringing one of the end surfaces of the component, which is brought into contact with the reference surface, among components stored in the cavity by the first step, into contact with an inclined surface of the engaging groove, inclined with respect to a direction orthogonal to a direction which connects the one end and the other end of the engaging groove, from the one end of the engaging groove to the predetermined position that is located between the one end and the other end of the engaging groove; and a second sub step of further inclining the component by bringing a biasing member, including a surface, into contact with a portion of the component projecting from the first main surface at the predetermined position, and by rotating the component about a corner or a rounded corner of the component on a valley on one side of an inclined surface of the engaging groove by biasing a portion of the component along with the relative movement of the conveyance member with respect to the base such that the one end surface of the component is rotated away from the inclined surface, thus separating the end surface of the component from the inclined surface during said rotation about the corner or the round corner, and after the second step is finished, the attitude of the component is changed into an attitude where the side surface is brought into contact with the reference surface.

5. The attitude changing method according to claim 4, wherein in the second step further comprises sucking the component stored in the cavity in a direction opposite to a direction that the component is biased by the biasing member.

6. An aligning method, comprising:

the attitude changing method of claim 4, wherein in the first step of the attitude changing method, the component is supplied to the cavity in such a manner that the end surface of the component is brought into contact with the reference surface or in such a manner that the side surface of the component is brought into contact with the reference surface, the component which is supplied into the cavity in such a manner that the end surface is brought into contact with the reference surface in the first step is brought into an attitude where the side surface is brought into contact with the reference surface after the second step is finished, and the component which is supplied into the cavity in such a manner that the side surface is brought into contact with the reference surface in the first step maintains an attitude in which the side surface contacts with the reference surface after the second step is finished.

* * * * *